US008214701B1

(12) United States Patent
Malhotra et al.

(10) Patent No.: US 8,214,701 B1
(45) Date of Patent: Jul. 3, 2012

(54) HARDWARE AND SOFTWARE DEBUGGING

(75) Inventors: Shawn Malhotra, Toronto (CA);
Deshanand Singh, Mississauga (CA)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 12/425,958

(22) Filed: Apr. 17, 2009

(51) Int. Cl.
*G01R 31/28* (2006.01)
(52) U.S. Cl. ...................................................... 714/725
(58) Field of Classification Search .................. 714/25, 714/39, 45, 726, 38, 38.1, 46, 30, 725, 48, 714/57, 724, 723, 3, 7; 716/116
See application file for complete search history.

(56) References Cited

U.S. PATENT DOCUMENTS

| | | | |
|---|---|---|---|
| 5,535,331 A * | 7/1996 | Swoboda et al. ............... | 714/45 |
| 6,243,836 B1 * | 6/2001 | Whalen ........................... | 714/45 |
| 6,247,146 B1 * | 6/2001 | Wheatley et al. ............... | 714/38 |
| 6,601,189 B1 * | 7/2003 | Edwards et al. ................ | 714/30 |
| 6,708,290 B2 * | 3/2004 | Swoboda et al. ............... | 714/30 |
| 6,826,717 B1 * | 11/2004 | Draper et al. ................... | 714/39 |
| 7,043,668 B1 * | 5/2006 | Treue et al. ..................... | 714/45 |
| 7,178,133 B1 * | 2/2007 | Thekkath ...................... | 717/128 |
| 7,231,551 B1 * | 6/2007 | Treue et al. ..................... | 714/30 |
| 7,478,299 B2 * | 1/2009 | Brandyberry et al. ......... | 714/727 |
| 7,827,510 B1 | 11/2010 | Schubert et al. | |
| 7,836,416 B2 * | 11/2010 | Schubert et al. .............. | 716/106 |
| 7,950,004 B2 * | 5/2011 | Vieira et al. ................... | 717/125 |
| 2001/0034859 A1 * | 10/2001 | Swoboda et al. ............... | 714/39 |
| 2001/0042226 A1 * | 11/2001 | Dzoba et al. ................... | 714/39 |
| 2009/0249045 A1 * | 10/2009 | Berg et al. ..................... | 712/227 |
| 2011/0029830 A1 * | 2/2011 | Miller et al. .................. | 714/734 |
| 2011/0060546 A1 * | 3/2011 | Miller et al. .................. | 702/120 |

OTHER PUBLICATIONS

Nios II, "Nios II Hardware Development Tutorial", Altera Corporation, 2007. [Retrieved on Apr. 17, 2009]. Retrieved from the internet http://www.altera.com/literature/tt/tt_nios2_hardware_tutorial.pdf.
Nios II, "Nios II C2H Compiler User Guide, Version 8.1", Altera Corporation, 2008. [Retrieved on Apr. 17, 2009]. Retrieved from the internet http://www.altera.com/literature/ug/ug_nios2_c2h_compiler.pdf.
Nios II, "Nios II IDE Help System, Version 9.0", Altera Corporation 2009. [Retrieved on Apr. 17, 2009]. Retrieved from the internet http://www.altera.com/literature/ug/ug_nios2_ide_help.pdf.
ModelSim DE Reference Manual, Software Version 10.0, 1991-2010, Mentor Graphics Corporation, 643 pages.
ModelSim DE Tutorial, Software Version 10.0, 1991-2010, Mentor Graphics Corporation,141 pages.
ModelSim DE User's Manual, Software Version 10.0, 1991-2010, Mentor Graphics Corporation, 1191 pages.
ModelSim PE Reference Manual, Software Version 10.0, 1991-2010, Mentor Graphics Corporation, 611 pages.
ModelSim PE Tutorial, Software Version 10.0, 1991-2010, Mentor Graphics Corporation, 141 pages.

(Continued)

*Primary Examiner* — Phung M Chung
(74) *Attorney, Agent, or Firm* — Weaver Austin Villeneuve & Sampson LLP

(57) ABSTRACT

An integrated hardware and software debugging system debugs software running on a processor and debugs hardware blocks that perform operations separate from the processor. Cycle traces are recorded for hardware block operations and the data is presented to a user through the same interface used for software debugging. Where hardware blocks are implemented in configurable circuitry (such as an FPGA) from source code, hardware debugging is linked to the source code to simulate stepping through the source code.

20 Claims, 5 Drawing Sheets

OTHER PUBLICATIONS

ModelSim PE User's Manual, Software Version 10.0, 1991-2010, Mentor Graphics Corporation, 1099 pages.
ModelSim SE Reference Manual, Software Version 10.0, 1991-2010, Mentor Graphics Corporation, 931 pages.
ModelSim SE Tutorial, Software Version 10.0, 1991-2010, Mentor Graphics Corporation, 205 pages.
ModelSim SE User's Manual, Software Version 10.0, 1991-2010, Mentor Graphics Corporation, 1443 pages.

* cited by examiner

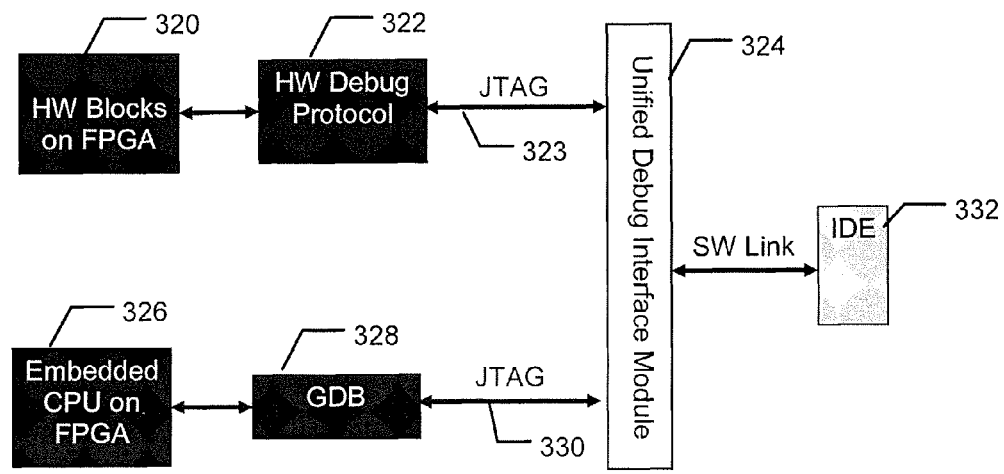
FIG. 3
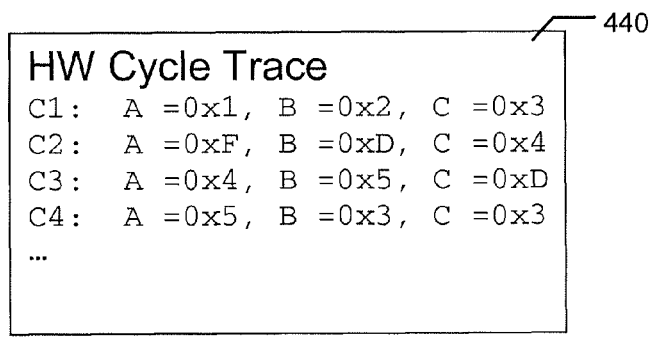
FIG. 4
| Line # in Source Code | Cycle in which line's function is completed |
|---|---|
| 1 | 5 |
| 2 | 5 |
| 3 | 8 |
| 4 | 4 |
FIG. 5

HARDWARE AND SOFTWARE DEBUGGING

BACKGROUND OF THE INVENTION

1. Field of the Invention

The present invention relates to debugging of integrated circuits, and in particular to debugging of integrated circuits that include hardware blocks that are implemented in programmable logic.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical lines that may or may not extend the length of the PLD.

PLDs have configuration elements that may be programmed or reprogrammed. Configuration elements may be realized as RAM bits, flip-flops, EEPROM cells, or other memory elements. Placing new data into the configuration elements programs or reprograms the PLD's logic functions and associated routing pathways. Configuration elements that are field programmable are often implemented as RAM cells (sometimes referred to as "CRAM" or "configuration RAM"). However, many types of configurable elements may be used including static or dynamic random access memory, electrically erasable read-only memory, flash, fuse, and anti-fuse programmable connections.

Some PLDs include a processor with fixed hardware, and some configurable hardware that is external to the processor. Such external hardware (e.g. FPGA or other configurable hardware) may be configured as hardware blocks that perform particular operations for the processor. The hardware blocks provide an alternative to performing those operations by software in the processor. In many cases, operations can be performed faster by such hardware blocks than by processor software, thus improving overall performance. When a particular operation is identified as suitable for implementation in a hardware block, the software code for that operation may be used as source code to configure the hardware block. Such conversion from source code to a hardware block in an FPGA or other configurable circuitry may be performed in an automated manner.

In some cases, when software for a processor is implemented using external hardware blocks for some operations, debugging the resulting integrated circuit may be difficult. In particular, conventional software debugging does not facilitate debugging hardware, while hardware debugging does not facilitate software debugging. Generally, hardware and software debugging are performed separately, in isolation from each other, which may be time consuming and may require personnel with two different skill sets (e.g. software engineers may not be familiar with hardware debugging, and hardware engineers may not be familiar with software debugging.)

SUMMARY OF THE INVENTION

According to some embodiments of the present invention, debugging of a hardware block is integrated with debugging of software run on a processor that is connected to the hardware block. Debugging is performed using a common interface that carries many functions of software debugging over to hardware debugging. Such features may allow a software engineer to perform hardware debugging without detailed knowledge of the underlying hardware, and without having to learn to use specialized hardware debugging tools. Such integrated debugging systems may allow a user to step through hardware operations in a cycle-by-cycle manner, even though the operations are completed without interruption. Breakpoints and other features generally associated with software debugging may also be available for hardware debugging in such systems.

A method of debugging integrated circuit hardware and software together according to an embodiment of the present invention comprises: providing a target integrated circuit that includes a Central Processing Unit (CPU) executing software, and a hardware block that is implemented in programmable logic, the hardware block configured to perform an operation in response to an instruction in the software; stepping through execution of the software such that execution of the software by the CPU is interrupted and an output is provided to a user between steps; when the stepping reaches the instruction, performing the operation in the hardware block without interrupt, and recording selected variables for each of one or more clock cycles of the hardware block; and subsequently providing recorded values of the selected variables for the one or more clock cycles to a user in sequence.

A method of debugging integrated circuit hardware and software together, and presenting combined results to a user according to an embodiment of the present invention comprises: stepping through execution of software by a processor in an integrated circuit; at each step of the software, providing an output to a user display and waiting for user input before continuing to a subsequent step; encountering an instruction in the software that requires performance of an operation by a hardware block that is outside the processor, the hardware block implemented in programmable logic; in response to encountering the instruction, performing the operation by the hardware block, the performing extending over a plurality of clock cycles; recording predetermined variables for each of the plurality of clock cycles in a cycle trace; and subsequently providing cycle trace data to the user display such that the user can step through the cycle trace data in a cycle-by-cycle manner.

According to an embodiment of the present invention, an article of manufacture comprising a computer readable medium having computer readable program code means embodied therein for debugging integrated circuit hardware and software, the computer readable program code means in said article of manufacture comprising: computer readable program code means for stepping through software executing on a Central Processing Unit (CPU) on an integrated circuit; computer readable program code means for recording output data from a hardware block on the integrated circuit, the output data recorded for two or more clock cycles of an operation; and computer readable program code means for allowing a user to step through hardware execution by the hardware block by presenting the recorded output data from the two or more cycles to a user in a sequential manner.

BRIEF DESCRIPTION OF THE DRAWINGS

The invention may best be understood by reference to the following description taken in conjunction with the accompanying drawings, which illustrate specific embodiments of the present invention.

FIG. 3 shows integrated debugging of hardware and software.

FIG. 4 shows an example of a cycle trace.

FIG. 5 shows the relationship between lines of source code and cycles of a hardware block.

DETAILED DESCRIPTION OF ILLUSTRATED EMBODIMENTS

The present invention will now be described in detail with reference to various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
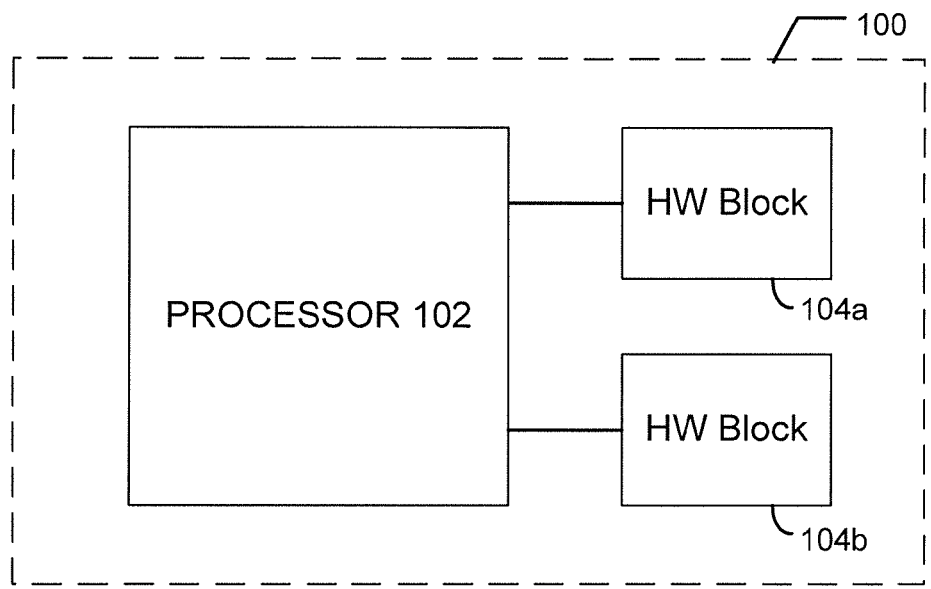
FIG. 1 shows a portion of an integrated circuit including a processor and hardware blocks.

FIG. 1 shows an example of a portion of an integrated circuit 100 in which aspects of the present invention may be applied. The integrated circuit 100 includes a processor 102, such as a Central Processing Unit (CPU), and two hardware blocks 104a, 104b. It will be understood that a processor may use any number of hardware blocks and that the present invention is not limited to any particular number. Also, multiple processors may be provided in a single integrated circuit. The hardware blocks 104a-b of FIG. 1 are formed in an FPGA portion of the integrated circuit. Generally, such configuration is the result of identifying particular operations in the processor's software that could be more efficiently performed by hardware blocks, and configuring FPGA portions accordingly. Instead of performing such operations by software in the processor, these operations are performed by the hardware block under the control of the processor.

In one example, source code for a processor is analyzed to identify suitable operations for implementation in hardware blocks. Then, configurable elements are configured to form the corresponding hardware blocks. Executable code is generated for the processor, with appropriate code to ensure that the selected operations are performed by hardware blocks in response to instructions from the processor, and not in the processor itself. For example, certain arithmetic functions such as addition, subtraction, multiplication, and division may be performed by hardware blocks outside the processor instead of by software in the processor. Executable code in the processor is configured to send the appropriate data to a hardware block and receive a result from the hardware block.

In one example, source code may require two numbers to be multiplied together and the result used for some further calculation in the processor. Instead of implementing such an operation using executable code in the processor, a hardware block may be configured as a multiplier, and executable code in the processor is configured to send a multiplicand and multiplier to the hardware block and obtain a result from the hardware block. This may be faster than performing multiplication in the processor. In some examples, source code may be written in C or C++ software and then converted to hardware implementation using systems such as a C2H (C to Hardware) compiler from Altera.

Generally, in developing a new integrated circuit, debugging is performed to identify and fix any flaws or "bugs" that may be present. Such bugs may be in hardware, software, or may result from some combination of hardware and software. Typically, where new software is being debugged on a known hardware platform, only software debugging is performed. However, where new hardware is used, hardware debugging may also be necessary. For example, where hardware blocks are configured in an FPGA portion of an integrated circuit, some hardware debugging is desirable to ensure that the hardware implementation works.

Figure 2A:
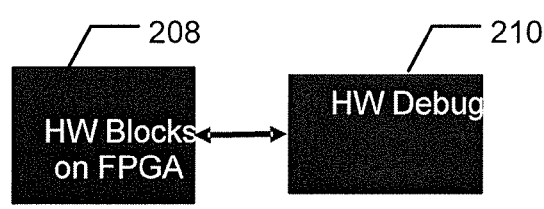
FIG. 2A shows debugging of hardware blocks.

FIG. 2A shows an example of debugging of hardware blocks 208 of an FPGA portion of an integrated circuit. An integrated circuit may be physically attached to a testing apparatus, for example using a JTAG interface on the integrated circuit. Outputs from such an interface are then monitored by appropriate hardware debugging software 210 while different inputs are provided to the integrated circuit, and different operations are performed by the integrated circuit. An example of a debugging application that may be used for hardware debugging is ModelSim. Generally, hardware debugging applications such as ModelSim, when debugging a hardware block, do not correlate the hardware block's operation with source code from which the hardware block was generated.

Figure 2B:
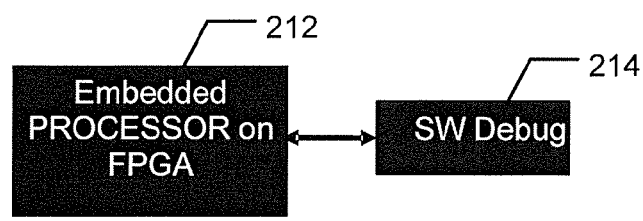
FIG. 2B shows debugging of software on a processor.

FIG. 2B shows an example of debugging of software running on an embedded processor 212 of an integrated circuit. Software may be debugged by physically attaching an integrated circuit to a testing apparatus 214 and monitoring outputs as the software is executed. In some cases, a JTAG interface may be used to debug software of an embedded processor. Typically, software debugging provides several advanced features including breakpoints, instruction traces, variable watches, etc. An example of a debugging application that may be used for software debugging is the Nios II debugger from Altera.

Generally, debugging an integrated circuit such as shown in FIG. 1 requires separate debugging of hardware and software. Many engineers are only familiar with one type of debugging, i.e. software engineers may be unfamiliar with hardware debugging and hardware engineers may be unfamiliar with software debugging. So debugging of an integrated circuit may require two individuals, or groups of individuals. Such separate testing, especially if performed by different individuals, may be cumbersome and time consuming.

Another alternative for debugging is to model any hardware blocks in software so that debugging may be performed entirely in software. A cycle-accurate model of hardware blocks is provided to the debug tool. Because the hardware blocks are then debugged in software, advanced debugging features such as breakpoints, instruction traces, variable watches, etc are available. However, developing a cycle-accurate model of a hardware block is difficult and time-consuming and introduces another possible source of errors (i.e. if the model is not accurate, bugs in the hardware may be missed, or bugs may be "fixed" where no bug exists in the hardware). Also, cycle-accurate simulations generally do not allow tests to run in real time, thus hiding some timing-related problems that may only occur in real-time.

Where an integrated circuit includes hardware blocks that are generated from source code, such as by a C2H compiler, a user can generally perform debugging in software, based on the assumption that the source code accurately represents the hardware generated from it. However, such a system must generally be tested at a slower speed than it would run at if implemented in hardware. So this may work for relatively slow designs. However, frequently hardware blocks are used where high speed is desirable and low speed testing may not accurately simulate real operation. Such hardware blocks should be tested when running in real time, as many subtle errors may only be present when the system is running at speed, and may not be observable when running at a slower software simulation speed.

According to an embodiment of the present invention, an integrated debugging tool provides software and hardware debugging functions. Such a tool may have the functionality and the appearance of a conventional software debugging tool, since such tools are familiar to many engineers, where hardware debugging tools are generally less familiar. According to an example, the following features are provided in such an integrated debugging tool:

The ability to "single-step" through software execution, and similarly step cycle-by-cycle through hardware block operation.

The ability to halt execution with a breakpoint (an actual halt in software execution, a simulated halt in hardware execution)

The ability to provide a "variable watch" to see the current state of the system.

FIG. 3 shows a block diagram of an integrated debugging tool according to an embodiment. In particular, hardware blocks 320 are shown connecting through a hardware debug protocol 322 (through JTAG interface 323) with a Unified Debug Interface Module (UDIM) 324. Software on an embedded CPU 326 is also monitored through a Gnu Debug Client (GDC) 328 over a JTAG interface 330, which connects to the UDIM 324. The UDIM 324 is in turn connected to an Integrated Development Environment (IDE) software module 332, which provides a user with a common interface for both hardware and software debugging. The UDIM 324 integrates the hardware debug protocol to provide the IDE 332 with integrated input which generally has the look and feel of a software debug tool. This is in contrast with many previous systems, which have used separate hardware and software debugging tools in isolation, with each debugging tool having a different interface, with different functions. The UDIM 324 may be implemented as a software module running on a host Personal Computer (PC) or other platform. Typically, this is the same platform that the IDE runs on. However, in some examples, these modules may be on separate platforms connected together over a network, or connected in some other way. A UDIM may also be implemented by dedicated hardware, or a combination of hardware and software. The UDIM passes information (e.g. variable values, instruction traces, etc.) to the IDE so that they can be displayed to the user.

An integrated debugging system may provide a user interface for hardware debugging that has many of the same features that are present in software debugging tools. Thus, a suitable hardware debug protocol should enable UDIM and IDE to provide the debugging functions that GDB enables for software running on the embedded processor.

According to an example, an interface for hardware debugging is provided by a SignalTap II Logic Analyzer or similar system, which communicates with the UDIM via a JTAG connection. In this arrangement, the IDE allows the user to specify instructions (e.g. to watch a certain set of variables). The UDIM then translates these instructions into a SignalTap II file (STP file). The STP file would define which hardware signals need to be monitored (based on the user's request), and use the FPGA's resources to store the collected data (i.e. the standard SignalTap II flow). Such an STP file may be simply an XML expression of which signals to tap and specific identification of when to trigger data collection.

For custom designed hardware blocks, the user may specify the registers they are interested in monitoring directly in the IDE. However, for automatically generated hardware (such as generated by C2H), the auto-generation tool may create a data file of debug information, much like software compilers can create debug symbols in their compilation. This debug information may contain a mapping of software variables to hardware registers. By using such a mapping, a user can specify software variables that they would like to monitor, and the UDIM can translate this into a set of hardware registers to tap in the STP file by using the mapping. Once an STP file has been generated, the hardware may automatically send cycle-by-cycle information about the tapped registers back to the UDIM over a JTAG connection. Various examples of integrated debugging tool functionality are provided below. However, it will be understood that such examples are not exhaustive and are not intended to be in any way limiting.

One important data structure that may be used in hardware debugging is a cycle trace. A cycle trace is a table of values for all signals being monitored with SignalTap, and their values during each cycle of execution on the hardware target. An example of a cycle trace 440 is illustrated in FIG. 4, which shows the values of three variables (A, B, and C) over the first four clock cycles (cycles denoted by C1, C2, C3, etc) of execution on the hardware target.

In some cases, it is possible to generate additional debugging information for a system when a hardware module is automatically generated with a tool such as a C2H tool. In addition to automatically figuring out which variables map to which registers, a hardware generation tool may also create a mapping of lines in source code to clock cycles in hardware. Such a mapping may specify, for each line of code, which cycle in hardware must be completed for the line of code to be completed. This mapping can be many-to-one or one-to-many. An example of such a mapping is shown in FIG. 5. In the example of FIG. 5, it is specified that line 1 of a function converted to hardware will be complete after cycle 5 of the hardware block is completed. Line 2 of the source code is also completed during cycle 5. However, line 3 is not completed until cycle 8. Also note that the sequential nature of the code is not maintained and line 4 of the code is completed in cycle 4.

In general, while single-stepping through software is relatively easy to implement, an operation by a hardware block is generally performed without interruption. However, even though a hardware block may perform all the cycles of an operation without interruption, the results may be presented to a user in a cycle-by-cycle manner using data recorded during performance of the operation. Thus, once the hardware function is initiated, the hardware block is allowed to complete performance of its given operation, and a cycle trace for that operation is generated. At the same time, a software breakpoint is inserted after the hardware completes execution. This ensures that the system completes the hardware operation, but that the next software instruction is not executed until the user steps out of the hardware function.

When the hardware block performs its given operation, the UDIM stores a cycle trace for that operation, but the UDIM only releases information to the IDE when the user asks for it (e.g. by providing some user input to move to the next cycle). For example, if a user steps into a hardware function, the first step is to allow the hardware to execute to completion and generate a full cycle trace for its operation. Next, the user asks the IDE to single-step (in this case, to provide one cycle at a time). The IDE then asks the UDIM for the information from the first cycle. In this case, that information corresponds to the values of the tapped registers after completion of cycle 1, so the UDIM passes back all cycle 1 information to the IDE, and the information is displayed to the user. Next, the user advances one more step. The IDE asks the UDIM for the information for the next cycle. The UDIM returns the values for cycle 2, and the IDE displays this to the user. This interface allows the user to "single-step" through each cycle of hardware execution by the hardware block. This process may be made even more powerful if the hardware was auto-generated with a tool such as C2H. In this case, extra debugging information may be generated, which allows for a mapping between lines of code and hardware cycles.

Figure 6:
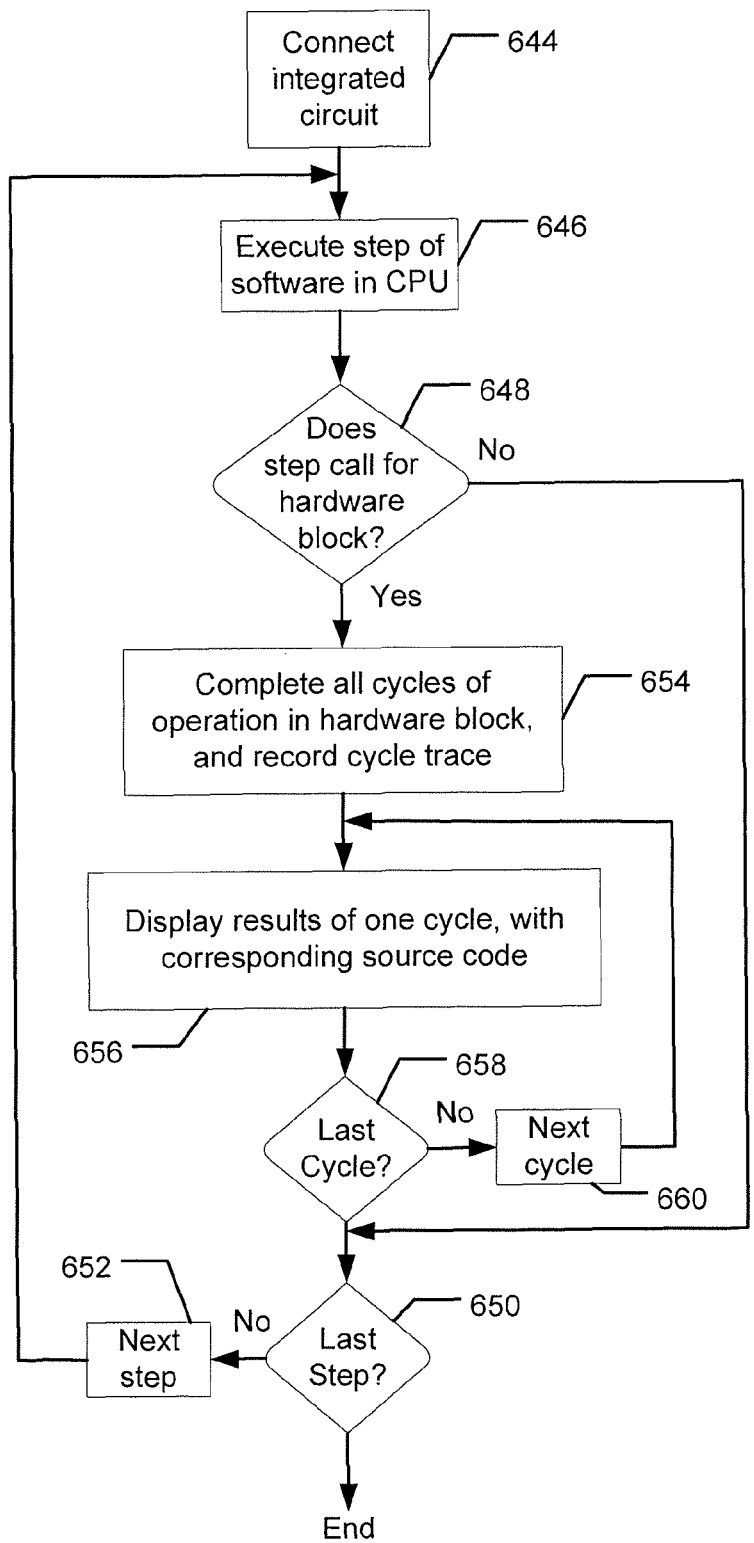
FIG. 6 is a flowchart showing operation of an integrated hardware and software debugging system.

FIG. 6 is a flowchart that illustrates operation of an example integrated debugging tool. An integrated circuit is connected 644 to the debugging tool. Then a first step of software is executed 646 by the CPU using the integrated debugging tool to step through the software. The results of execution of the first step are generally displayed to the user at this point, and the debugging tool may await a user input to move to the next step. If the step does not call for use of a hardware block 648, then the process skips down and either terminates, if it is the last step 650, or moves on to the next step 652. If a hardware block is used 648 then all cycles of the hardware block operation are completed 654 in a normal manner (without interruption) and a cycle trace is generated to record selected values at each cycle. Next, the results of the first cycle are displayed 656 to a user along with the source code that corresponds to that cycle. If this is the last cycle 658, the routine goes on to the next step 652 (or terminates if this is the last step 650). If it is not the last cycle 658, then the routing moves on to the next cycle 660. Generally, a user input is required at this point before moving on to display the results of the next cycle 656. This gives the impression of stepping through cycles of hardware execution in real-time, though in reality the hardware has already completed all cycles and the user is stepping through recorded data.

Example Operation

FIGS. 7-10 illustrate a particular example of a hardware block that performs the transformation given by the following source code:

```
int perform_transform(int orig_value)
{
Line 1: int return_value=0xFFFF;
Line 2: if (orig_value>THRESHOLD_VALUE)
    {
Line 3: return_value=orig_value;
    }
    else
    {
Line 4: return_value=orig_value * MULTVAL;
    }
Line 5: return return_value;
}
```

The mapping of source code to hardware for this operation is given in the following table:

| Line # in Source Code | Cycle in which line's function is completed |
|---|---|
| 1 | 1 |
| 2 | 1 |
| 3 | 2 |
| 4 | 2 |
| 5 | 6 |

Figure 7:
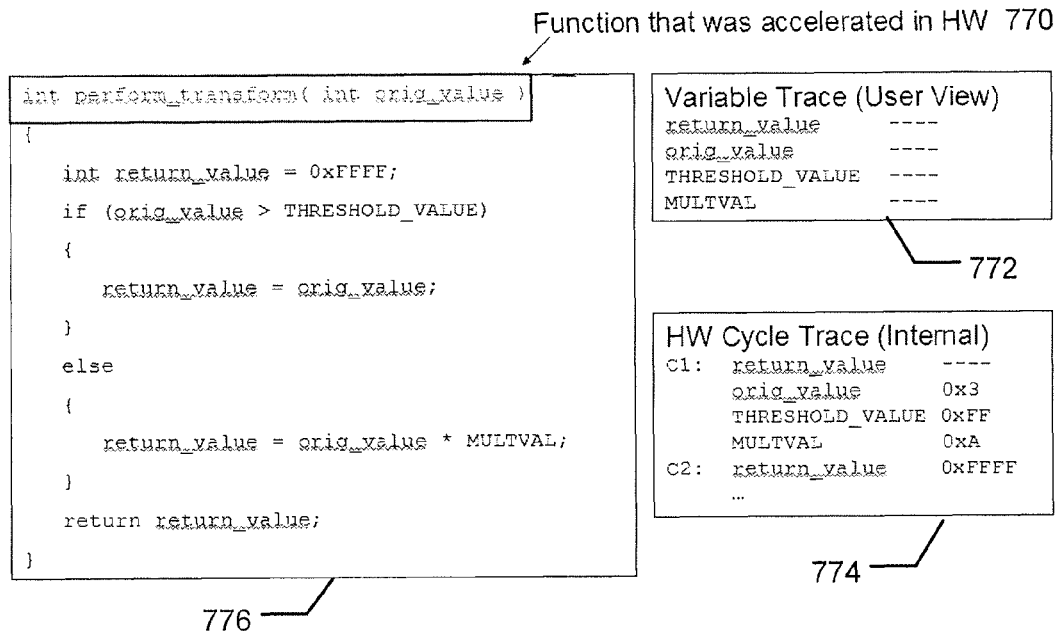
FIG. 7 shows data provided to a user by an integrated hardware and software debugging system.

When a user first steps into a hardware operation (i.e. reaches a line of CPU software that calls for an operation by a hardware block), the hardware block is allowed to execute to completion and generate a cycle trace which is stored in the UDIM, but not displayed to the user. The user is presented with the information shown in FIG. 7, which shows the function that was accelerated in hardware ("int perform_transform(int orig_value)) 770 along with the Variable Trace 772. A hardware cycle trace 774 is also shown to help illustrate how the integrated debugging system works, although in many cases the full cycle trace is hidden from the user. FIG. 7 shows only a portion of a cycle trace corresponding to the first two cycles (C1 and C2). However, a full cycle trace may extend over many cycles, so presenting the entire cycle trace may not be practical or helpful. In this example, all the source code 776 for the operation is displayed to the user, though in more complex operations, source code may be shown in smaller chunks that are easier to view. At this point, all variables are unset as far as the user knows. Also, a software breakpoint is inserted at the next line of software to be executed after this hardware operation, and this prevents the system from continuing execution after the cycle trace has been generated.

Figure 8:
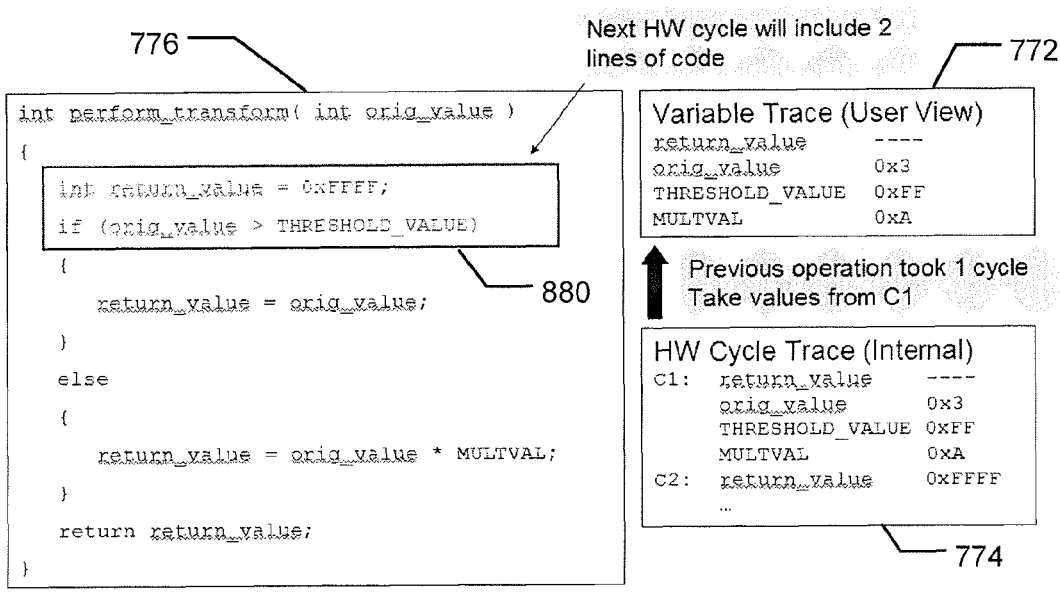
FIG. 8 shows data provided to a user by the integrated hardware and software debugging system of FIG. 7 at a subsequent time.
Figure 9:
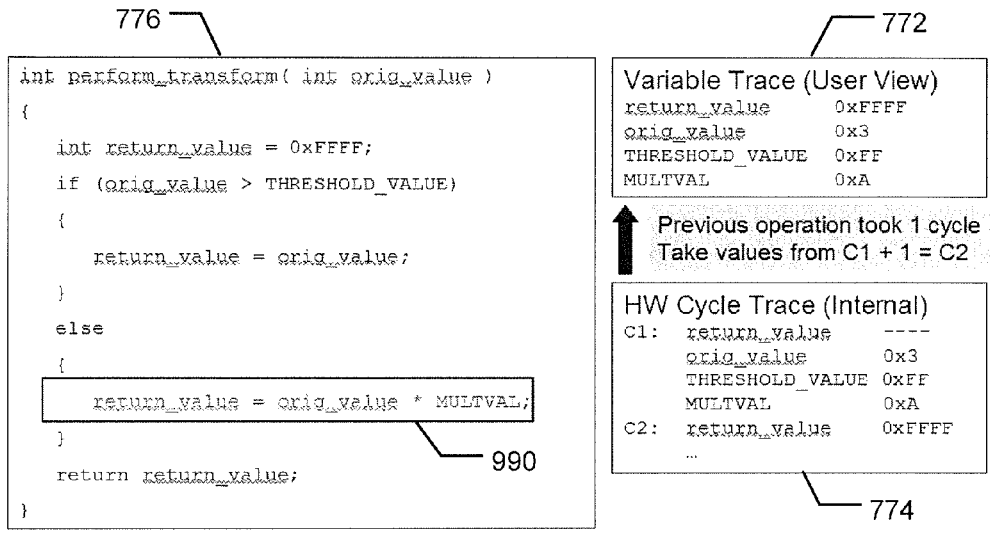
FIG. 9 shows data provided to a user by the integrated hardware and software debugging system of FIG. 8 at a subsequent time.

Next, the user may select a single-step mode, in which case they are presented with the screen shown in FIG. 8. When the user selects single-step mode, the IDE asks the UDIM for information on line 1 of the source code. The UDIM then looks at the mapping of lines to cycles, and finds that line 1 is complete after cycle 1, so the UDIM marks the "current state" as cycle 1 being complete. It then passes all variable values at this point to the IDE for display to the user. Additionally, it passes the IDE a list of all other lines of code that have been completed once cycle 1 is finished. In this case, line 2 is also completed when cycle 1 is completed. The IDE then highlights a block of code 880 that extends to the last line which was completed (in this case, line 2). This tells the user where they are in relation to the source code. In general, it is not possible to separately step through lines of source code like line 1 and line 2, which are implemented in hardware in a single cycle.

When the user provides another input to advance by another cycle they are presented with the information in FIG.

9. The IDE asks the UDIM for information about line 4, and the UDIM sees from the mapping that this line of code is completed after cycle 2. It then releases the values from the cycle trace at the end of cycle 2 to the IDE for display to the user. It also conveys to the user that there are no higher line numbers that completed execution at the end of cycle 2. Line 4 is highlighted 990 and the data from the cycle trace corresponding to cycle 2 is displayed to the user.

Figure 10:
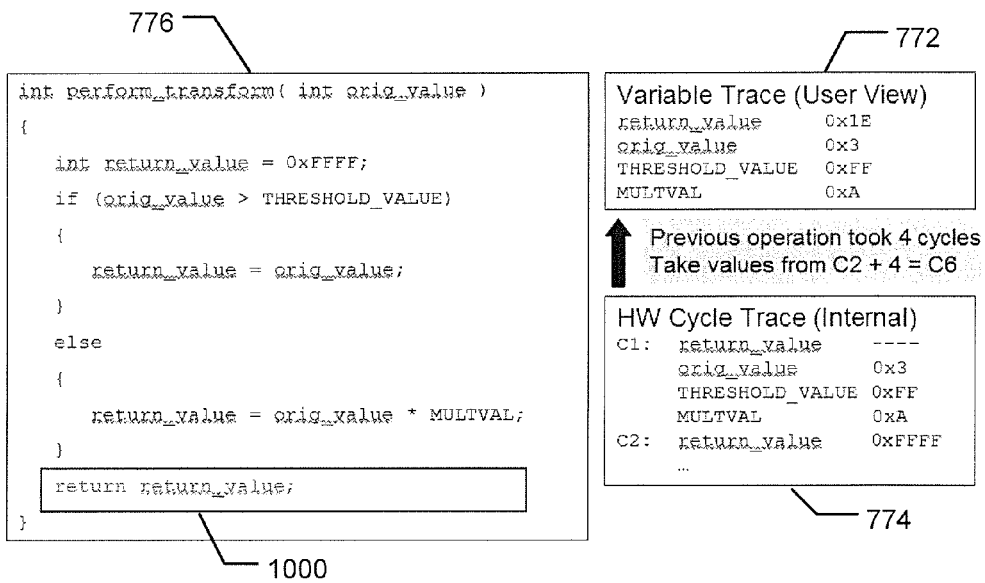
FIG. 10 shows data provided to a user by the integrated hardware and software debugging system of FIG. 9 at a subsequent time.

The user then provides an input to proceed to the next cycle as shown in FIG. 10. The UDIM returns all values corresponding to the completion of cycle 6 (the point where line 5 of source code 1000 is complete) and this information is displayed to the user. The Variable Trace 772 shows the return_value of 0x1E, which is the product of orig_value (0x3) and MULTVAL (0xA). The UDIM informs the IDE that no later lines of code have completed at this point.

One feature of the system described above is that it can provide a useful tool even where hardware operates out-of-order with respect to source code. For example, if line 5 had been completed in cycle 1, when the user stepped into the function for the first time, the UDIM would have told the IDE that the highest line of code completed after cycle 1 was line 5, and the IDE would have highlighted the block of code all the way up to line 5, informing the user that execution had completed to this point.

Breakpoints are commonly used in software debugging to stop execution of software at a particular point so that the state of the system (variable values etc.) can be examined at that point. In an example of an integrated debugging system, breakpoints may be used in hardware debugging also. Instead of stopping an operation by a hardware block at some intermediate point, the hardware block completes the operation without interrupt and a cycle trace records data from the hardware block for each cycle. When the user inserts a breakpoint in the middle of a hardware block operation, the IDE simply asks the UDIM for the variable values at this point of execution (the UDIM uses the source code line to hardware cycle mapping to figure this out). These variable values are then presented to the user.

While the above examples are based on hardware blocks that are generated from source code, other hardware blocks may be custom-designed and there may be no source code available for such hardware blocks. In this case, the integrated debugging system simply displays the cycle-by-cycle register values from the cycle trace and allows the user to step through these cycles to see how signals transition, or to simply view the entire operation in a single waveform diagram. The user can still simulate breakpoints and single-stepping, even without any source code, but breakpoints are specified in terms of hardware cycles and stepping is done cycle-by-cycle. The implementation of these features is mostly unchanged from the case where source code is available, except that each step is always one cycle (in the previous example, a line of source code could correspond to multiple cycles). This may allow for simpler implementation.

While the invention has been particularly shown and described with reference to specific embodiments thereof, it will be understood by those skilled in the art that changes in the form and details of the disclosed embodiments may be made without departing from the spirit or scope of the invention. It is therefore intended that the invention be interpreted to include all variations and equivalents that fall within the true spirit and scope of the present invention.

What is claimed is:

1. A method comprising:
   executing software including one or more variables on a processor included on an integrated circuit;
   reaching an instruction in the software that calls a hardware block to perform an operation in one or more clock cycles, wherein the hardware block is implemented using programmable logic on the integrated circuit;
   performing the operation in the hardware block without interrupt;
   storing the one or more variables; and
   providing stored values of the one or more variables to a user.

2. The method of claim 1, wherein the software comprises a source code that comprises a plurality of lines of code, wherein the hardware block is implemented based on the source code, and when the stored values from a clock cycle of the one or more clock cycles are presented to the user, one or more lines of code of the plurality of lines of code that correspond to the clock cycle are presented to the user.

3. The method of claim 2, further comprising:
   mapping the one or more lines of code to the one or more clock cycles; and
   rendering the one or more lines of code on a display, wherein the one or more lines are highlighted according to the one or more clock cycles.

4. The method of claim 1, further comprising obtaining software output through a JTAG port of the integrated circuit in response to said executing the software.

5. The method of claim 1, wherein the software comprises a first line of code and a second line of code, wherein said executing the software comprises executing the first line of code and executing the second line of code, said method further comprising waiting for an input from the user between said executing the first line of code and executing the second line of code.

6. The method of claim 5, wherein the one or more clock cycles comprise a first clock cycle and a second clock cycle, wherein the one or more variables have a first value stored in response to occurrence of the first clock cycle and a second value stored in response to occurrence of the second clock cycle, said method further comprising:
   waiting for an input from the user after displaying the first value and before displaying the second value; and
   displaying the second value in response to receiving the input.

7. A method comprising:
   executing a plurality of lines of code comprising one or more variables of software, wherein said executing is performed by a processor in an integrated circuit;
   providing an output to a user display in response to the execution of a first line of code of the plurality of lines of code;
   waiting for an input from a user before executing a second line of code of the plurality of lines of code;
   encountering an instruction in the software that commands performance of an operation by a hardware block, wherein the hardware block is located outside the processor and is implemented using programmable logic on the integrated circuit;
   performing the operation using the hardware block in a plurality of clock cycles;
   storing the one or more variables for a clock cycle of the plurality of clock cycles to generate cycle trace data; and
   providing the cycle trace data to the user display.

8. The method of claim 7, wherein the software comprises a source code, said method further comprising compiling the source code to implement the hardware block.

9. The method of claim 8, further comprising providing one or more lines of the source code to the user simultaneously with the cycle trace data corresponding to the one or more lines of the source code.

10. The method of claim 8, further comprising mapping one or more lines of the source code to one or more cycles of the plurality of clock cycles, wherein the clock cycle corresponds to two or more lines of the source code.

11. The method of claim 7, wherein the operation is performed by the hardware block without interruption between two or more clock cycles of the plurality of clock cycles, and the cycle trace data is presented to the user with interruptions between the two or more clock cycles.

12. The method of claim 7, further comprising receiving a breakpoint from the user and in response displaying the one or more variables for the clock cycle, wherein the clock cycle corresponds to the breakpoint.

13. A system comprising:
an integrated circuit comprising a hardware block, wherein the integrated circuit comprises a Central Processing Unit (CPU), wherein the CPU is operative to execute a software, wherein the hardware block is operative to output data to be stored for two or more clock cycles, wherein the two or more clock cycles comprise a first clock cycle and a second clock cycle, wherein the stored output data comprises a first portion and a second portion, wherein the first portion is generated in response to occurrence of the first clock cycle and the second portion is generated in response to occurrence of the second clock cycle; and
a computer operative to present the first portion to a user before presenting the second portion to the user.

14. The system of claim 13, wherein the computer is coupled via a plurality of contacts to the integrated circuit.

15. The system of claim 13, wherein the software comprises a source code, wherein the source code comprises a portion, wherein the computer is operative to display the first portion simultaneously with the portion of the source code corresponding to the first clock cycle.

16. The system of claim 13, wherein the software comprises a source code, wherein the source code comprises one or more lines of code, and wherein the computer is operative to use a mapping of the one or more lines of code with one or more clock cycles.

17. The system of claim 13, wherein the computer is operative to access a breakpoint from the user, wherein the breakpoint corresponds to the first clock cycle.

18. A system comprising:
means for processing;
means for performing hardware logic, wherein the means for processing is operative to execute a software, wherein the means for performing hardware logic is operative to provide data to be stored for two or more clock cycles, wherein the two or more clock cycles comprise a first clock cycle and a second clock cycle, wherein the stored output data comprises a first portion and a second portion, wherein the first portion is generated in response to occurrence of the first clock cycle and the second portion is generated in response to occurrence of the second clock cycle; and
means for presenting the first portion to a user before presenting the second portion to the user.

19. The system of claim 18, wherein the means for presenting is coupled via a plurality of contacts to the integrated circuit.

20. The system of claim 18, wherein the software comprises a source code, wherein the source code comprises a portion, wherein the means for presenting is operative to display the first portion simultaneously with the portion of the source code corresponding to the first clock cycle.

* * * * *